United States Patent [19]

Hosokawa et al.

[11] Patent Number: 5,458,977

[45] Date of Patent: Oct. 17, 1995

[54] ELECTROLUMINESCENCE DEVICE CONTAINING A THIN FILM ELECTRODE

[75] Inventors: Chishio Hosokawa; Tadashi Kusumoto, both of Sodegaura, Japan

[73] Assignee: Idemitsu Kosan Co., Ltd., Tokyo, Japan

[21] Appl. No.: 300,144

[22] Filed: Sep. 2, 1994

Related U.S. Application Data

[62] Division of Ser. No. 710,078, Jun. 4, 1991, Pat. No. 5,364,654.

[30] Foreign Application Priority Data

Jun. 14, 1990 [JP] Japan ..................... 2-154059

[51] Int. Cl.$^6$ ..................................... H05B 33/14
[52] U.S. Cl. .................. 428/411.1; 252/301.16; 252/301.35; 313/504; 428/917
[58] Field of Search ..................... 252/500, 512, 252/513, 514, 301.16, 301.35; 313/503, 504; 427/66; 428/457, 411.1, 917

[56] References Cited

U.S. PATENT DOCUMENTS

| | | | |
|---|---|---|---|
| 4,834,911 | 5/1989 | Carew | 252/500 |
| 5,049,409 | 9/1991 | Yoshimoto et al. | 427/122 |
| 5,059,863 | 10/1991 | Tashiro et al. | 313/504 |
| 5,121,029 | 6/1992 | Hosokawa et al. | 313/504 |
| 5,122,393 | 6/1992 | Tuppen et al. | 427/255.2 |
| 5,126,214 | 6/1992 | Tokailin et al. | 428/690 |
| 5,130,603 | 7/1992 | Tokailin et al. | 313/504 |
| 5,142,343 | 8/1992 | Hosokawa et al. | 357/17 |
| 5,336,546 | 8/1994 | Hironaka et al. | 428/209 |
| 5,338,430 | 8/1994 | Parsunaga et al. | 204/412 |
| 5,366,811 | 11/1994 | Higashi et al. | 428/457 |
| 5,389,444 | 2/1985 | Hosokawa et al. | 428/457 |

FOREIGN PATENT DOCUMENTS

| | | |
|---|---|---|
| 0278758 | 8/1988 | European Pat. Off. . |
| 0278757 | 8/1988 | European Pat. Off. . |
| 0281381 | 9/1988 | European Pat. Off. . |

*Primary Examiner*—Michael Lusignan
*Attorney, Agent, or Firm*—Frishauf, Holtz, Goodman, Langer & Chick

[57] ABSTRACT

A thin film electrode comprising an electron-injectable metal and an organic compound. Said thin film electrode has excellent uniformity and may be very thin and has a small volume resistivity. An electroluminescence device using said thin film electrode has high luminous efficiency, making it useful as a light-emitting material.

19 Claims, No Drawings

ELECTROLUMINESCENCE DEVICE CONTAINING A THIN FILM ELECTRODE

This is a division of application Ser. No. 07/710,078 filed Jun. 4, 1991 now U.S. Pat. No. 5,364,654 issued Nov. 15, 1994.

BACKGROUND OF THE INVENTION

1. Field of the Invention

The present invention relates to a thin film electrode for devices and an electroluminescence (hereinafter referred to as EL) device having said electrode, and a process for the production of said electrode and said EL device. Specifically, it relates to a thin film electrode for devices suitable for using as a cathode of an organic EL device and a process for the production thereof, and also an EL device providing an emission of light with high brightness and high efficiency and a process for the production thereof.

2. Description of Related Arts

Research into devices, paying attention to high fluorescence efficiency of an organic compound and utilizing an EL property of the organic compound, have been made for a long time. For example, Helffish, Dresner, Williams et el. have obtained an emission of blue light using anthracene (J. Chem. Phys., 44, 2902 (1966)). Vincett, Barlow et el. have prepared a luminescence device by the vacuum vapor deposition method using a condensed polycyclic aromatic compound (Thin Solid Films, 99, 171 (1982)).

However, both devices have low brightness and low luminous efficiency.

Recently, it has been reported that an emission of blue light of 100 cd/m$^2$ was obtained using tetraphenylbutadiene for a light emitting material (Japanese Patent Application Laid-Open No. 194393/1984). Moreover, it has been reported that an organic thin film EL device emitting a green light with a brightness of not less than 1000 cd/m$^2$ was developed by lamination of a hole-conducting diamine compound and a fluorescent aluminum chelate complex as a light emitting material (Appl. Phys. Lett., 51, 913 (1987)).

Moreover, it is reported that an EL emission of approximately 80 cd/m$^2$ was obtained using a distyryl benzene compound famous as a laser pigment, which has high fluorescence in the region of blue to bluish green, in a monolayer as a light emitting material (Europe Patent No. 0,319,881).

As a cathode of the above organic thin film EL device, an alkali metal, for example, Na:K alloy has been known as described in U.S. Pat. Nos. 3,173,050, 3,382,394 and the like. The device using said electrode has a maximum quantum yield of 0.01 to 0.08% (RCA Review, vol. 30, p. 322), and an extremely low work function. Besides, said device has high activity but no stability, though it has an electorn-injectable property. Therefore, said device is not suitable for practical use.

A tunnel injection cathode (U.S. Pat. No. 3,710,167, Proceedings of IEEE, p. 1863, 1970), which is made by coating the wafer comprising n-type Si with SiO$_2$ in a thickness of 20 to 40 Å, or by coating Al with Al$_2$O$_3$ in a thickness of 50 Å, has a quantum yield of 0.01 to 0.04%, using anthracene as a light emitting layer. However, though said cathodes have higher stability compared with the above cathodes using alkali metals, but they have defects that the formation of an extremely thin oxidized film is required and the reproduction is difficult.

Moreover, in U.S. Pat. No. 4,539,507, it is reported that an EL device using In as a cathode and comprising the structure of ITO/1,1-bis(4-di-p-tolylaminophenyl)cyclohexane (hole-transporting layer)/4,4'-bis(5,7-di-t-pentyl-2-benzooxazolyl)stilbene (electron-transporting layer)/In emits light with 340 cd/m$^2$ (quantum yield: 1.2%, power conversion effficiency: 0.14%) having a peak of 520 nm at an applied voltage of 22 V and a current density of 140 mA/cm$^2$. In said EL device, voltage to be applied can be decreased and brightness can be increased, but In as a cathode is poor in electron-injecting property and it leaves something to be improved.

Moreover, Europe Patent No. 0,278,757 discloses a cathode comprising plural metals other than alkali metals, at least one of which is a metal having a work function of not more than 4 eV, for example, a uniform, minute cathode with a good plane resistance value which is formed by vapor depositing Mg and any of Ag, In, Sn, Sb, Te and Mn on an organic compound. Concretely, a device using Mg and Ag as a cathode and comprising the structure of ITO/1,1-bis(4-di-p-tolylaminophenyl) cyclohexane/Al complex of oxine/Mg:Ag shows a light emission (green) of 0.05 mW/cm$^2$ (approximately 50 cd/m$^2$) having a power conversion efficiency of 0.45% at an applied voltage of 5 V.

In the cathode of an EL device, adhesion to an organic thin film, uniformity and minuteness are increased, and thus the improved stability, the decreased plane resistance and the increased luminous efficiency can be attained. However, in said cathode, for example, the volume resistivity of Mg:Ag (atomic ratio of 10:1) is 3.4×10$^{-5}$–6×10$^{-5}$ Ω·cm, which is 8 to 13 times as large as that of Mg bulk (polycrystal) of 4.45×10$^{-6}$ Ω·cm. This is because the uniformity and minuteness of the thin film are insufficient, which causes oxidation in the air. In some cases, adhesion to the organic layer is not good and an emission of light is not uniform. Moreover, since Ag, In or Al is used as a second metal, the temperature of the vapor deposition source is raised to as high as 800° C. or higher during vapor deposition and an organic thin film as an under layer is often damaged by radiation heat.

The present inventors have carried out research to develop a thin film electrode which has the same features as the above electrode comprising both a metal having a small work function other than alkali metals and the other metals, and which further has a uniform and minute thin film having a good adhesion to an organic layer and a good plane resistance value, without damaging an organic thin film as an under layer during formation of a thin film.

As a result, it has been found that the above object can be attained by using a specific metal and an organic compound. The present invention has been accomplished on the basis of such findings.

SUMMARY OF THE INVENTION

The present invention provides a thin film electrode for devices comprising an electron-injectable metal and an organic compound. The present invention also provides a process for production of a thin film electrode for devices, wherein said electron-injectable metal and said organic compound are co-vapor deposited. Further, the present invention provides an EL device using the above thin film electrode for devices as a cathode. Moreover, the present invention provides a process for production of an EL device, wherein said electron-injectable metal and said organic compound are co-vapor deposited to form a cathode.

DESCRIPTION OF PREFERRED EMBODIMENTS

The above electron-injectable metal comprises preferably a metal or an electroconducting compound having a work function of 4.1 eV or less, in order to inject electrons into a light emitting layer comprising an organic compound or into an electron-transporting zone such as an electron-injecting layer (electron-transporting layer) in an organic thin film EL device. Examples of said electron-injectable metal are Ba, Ca, Ce, Cs, Er, Eu, Gd, Hf, K, La, Mg, Na, Nd, Sc, Sm, Y, Yb, Zn and Li, as listed in the "Handbook of Chemistry", the 3rd edition, Fundamentals II, Maruzen, 1984, II-493. However, among them, the a group I metal such as Cs and Na having a small work function has an extremely high reactivity and is difficult to be stabilized.

Accordingly, the preferable metals to be used for a thin film electrode of the present invention are Gd, Zn, In, Ta, Ba, Ca, Ce, Er, Eu, Hf, La, Mg, Nd, Sc, Sm, Y, Yb, Zn and the like.

By using said electron-injectable metal as a constituent of a thin film electrode, the operating voltage of the device can be decreased, and the luminous quantum yield and the luminous efficiency of the device can be improved.

On the other hand, as to the above organic compound, various compounds can be used. For example, an organic low- and high-molecular compound having the property of adhering to or combining with the above electron-injectable metal, preferably an organic compound having the ability of forming complexes with an electron-injectable metal or having an acceptor property.

The organic compound having an acceptor property is, as described in "Chemistry of Conducting Low-Dimentional Substance", Gakkai Shuppan Center, 1983, p. 61, a compound having an electron-accepting group, such as —CN,

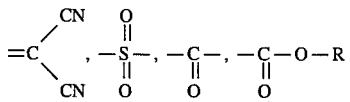

(R is an alkyl group, an aryl group, an alkyl-substituted aryl group or a hydrogen atom), —$NO_2$, —X , (X is a halogen atom),

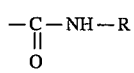

(R is an alkyl group, an aryl group, an alkyl-substituted aryl group, an alkoxy-substituted aryl group or a hydrogen atom), and optionally a compound having a quinoid structure in order to strengthen an electron-accepting property. The compounds represented by the following structural formulas (a) to (e) can preferably be used.

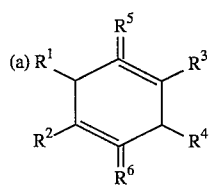

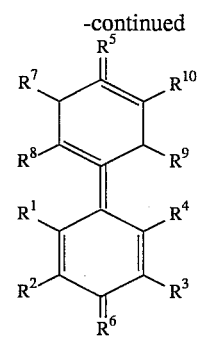

In the above general formula (I), $R^1$, $R^2$, $R^3$ and $R^4$ are individually an alkyl group, an alkoxyl group, a halogen atom, a nitro group, a cyano group, an alkoxycarbonyl group, or an aryl group. The carbon atoms constituting $R^1$ and $R^2$, and $R^3$ and $R^4$ may combine with each other to form a saturated or unsaturated six-membered ring or five-membered ring. $R^5$ and $R^6$ are individually an electron-accepting group, a dicyanomethylene group, a dicyanocarbonylmethylene group, an oxygen atom, a cyanoimino group, a cyanoalkoxycarbonylmethylene group, a dialkoxycarbonylmethylene group, a methylene dicarboxylate group, or a methylene cyanocarboxylate group.

In the above general formula (II), $R^5$ and $R^6$ are electron-accepting groups as defined in the general formula (I), and $R^1$, $R^2$, $R^3$, $R^4$, $R^7$, $R^8$, $R^9$, and $R^{10}$ are the similar groups to $R^1$ to $R^4$ in the general formula (I).

Specific examples of the compounds having such structures are shown below (Japanese Patent Application Laid-Open Nos. 149259/1982, 225151/1986, and 233750/1986; U.S. Pat. Nos. 4,869,984, and 4,869,985).

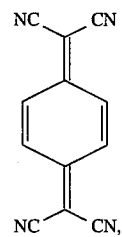

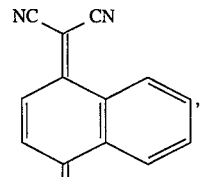

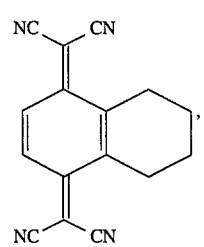

-continued
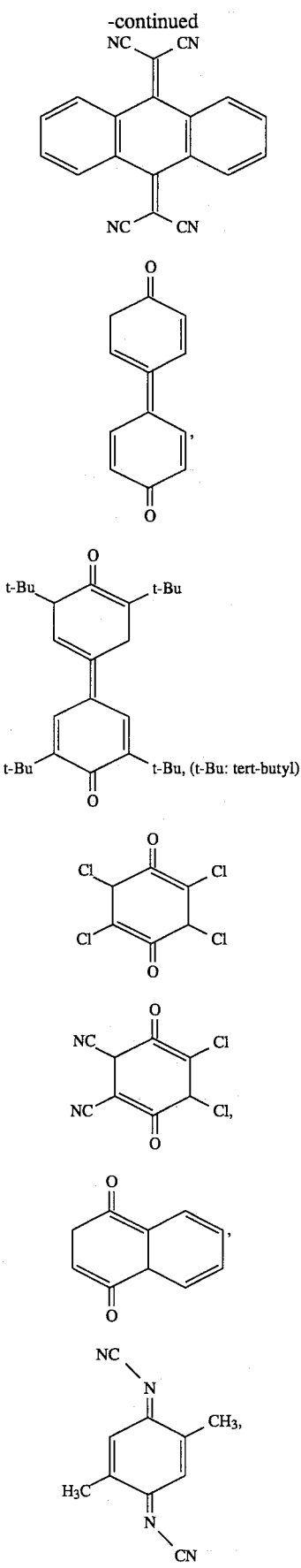
-continued
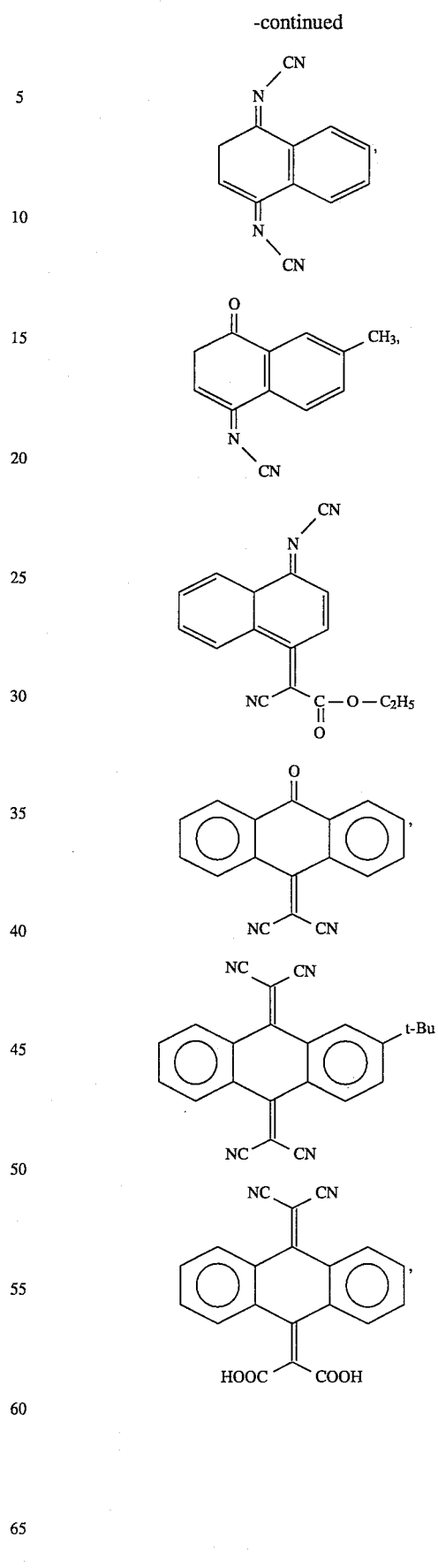

-continued

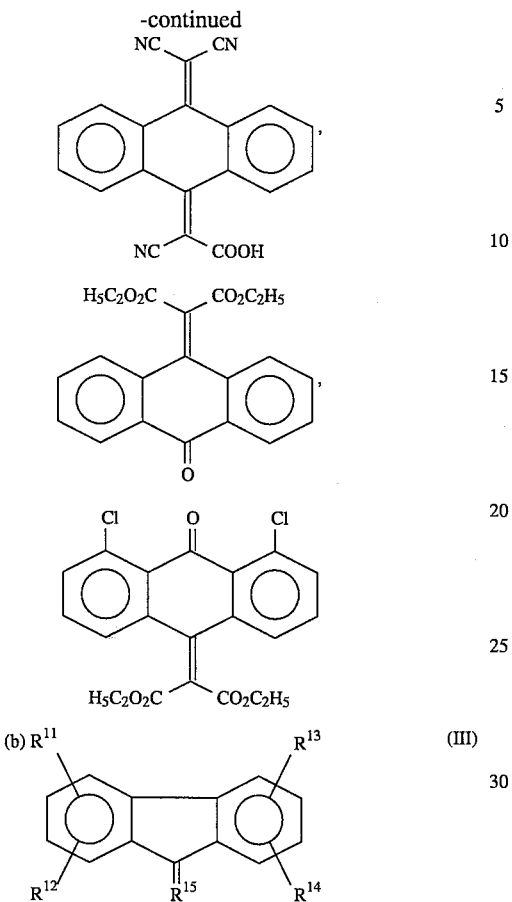

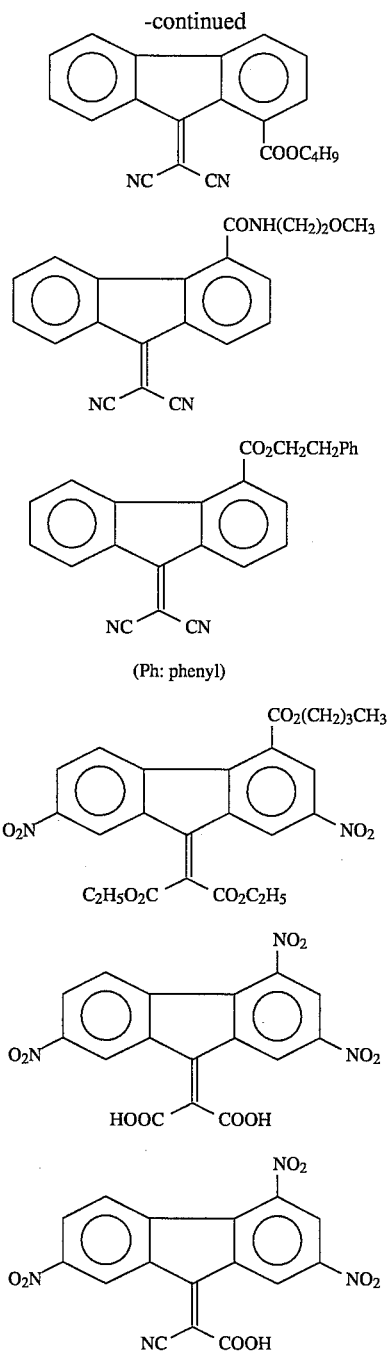

(b)

$$\text{(III)}$$

In the compound represented by the above general formula (III), $R^{11}$ to $R^{14}$ are individually an acyl group, an alkoxycarbonyl group, a nitro group, an alkylamino group, a carbonyl group, an arylalkyl group, an aryloxycarbonyl group, a benzyloxycarbonyl group, a phenethyloxycarbonyl group, or an aminocarbonyl group. $R^{15}$ is an electron-attractive group such as a dicyanocarbonylmethylene group, an oxygen atom, a dicyanomethylene group, a cyanoimino group, a cyanoalkoxycarbonylmethylene group, a dialkoxycarbonylmethylene group, a methylene dicarboxylate group, or a methylene cyanocarboxylate group.

Specific examples are shown below (Japanese Patent Application Laid-Open Nos. 69657/1985, 143764/1986, and 148159/1986).

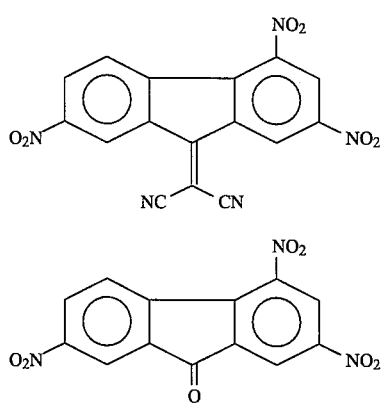

(c) 4H, -thiopyran-1,1-dioxide derivative represented by the following general formula (IV) (Japanese Patent Application Laid-Open No. 222477/1985 ).

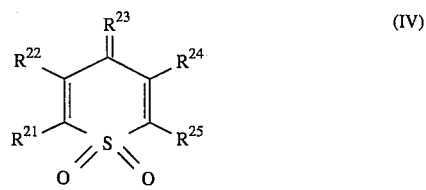

$$\text{(IV)}$$

In the above formula, $R^{23}$ is an electron-accepting group. $R^{21}$ and $R^{25}$ are individually an alkyl group or an aryl group. $R^{22}$ and $R^{24}$ is individually a hydrogen atom or an alkoxycarbonyl group. The carbon atoms constituting $R^{21}$ and $R^{22}$ and $R^{24}$ and $R^{25}$ may combine with each other to form a condensed unsaturated six-membered ring. Said thiopyran-oxide derivative represented by the general formula (IV) shows a half-wave reduction potential on the positive side of −0.5 V, and is used as a preferable acceptor molecule. Specific examples are shown below.

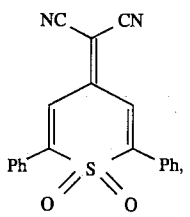

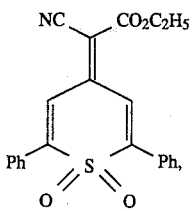

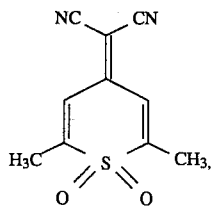

(d) An aromatic compound and a heterocyclic compound having a dicarboxylic acid anhydride structure represented by the formula:

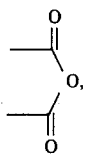

or an imide dicarboxylate structure represented by the formula:

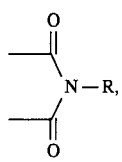

(R is an alkyl group, an aryl group, an alkyl-substituted aryl group or an alkoxy-substituted aryl group) are acceptor molecules. These are particularly preferable compounds.

Specific examples are shown below.

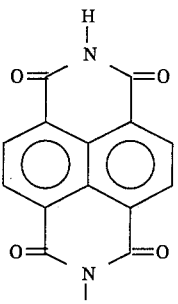

(NTDI),

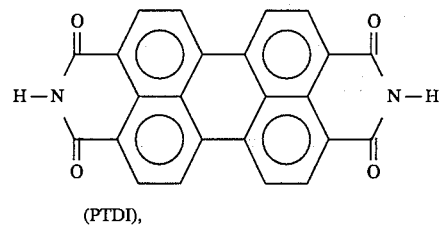

(PTDI),

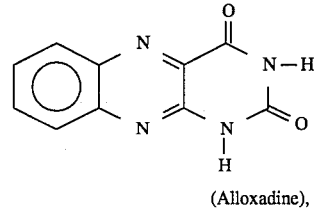

(Alloxadine),

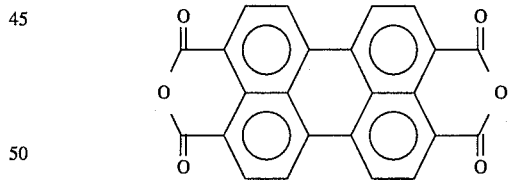

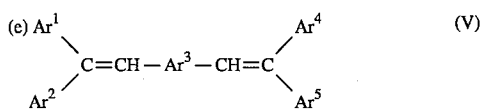

(e) $\quad \underset{Ar^2}{\overset{Ar^1}{\diagdown}} C = CH - Ar^3 - CH = C \underset{Ar^5}{\overset{Ar^4}{\diagup}}$  (V)

The above $Ar^1$, $Ar^2$, $Ar^3$, $Ar^4$ and $Ar^5$ are individually an aryl group, an alkyl-substituted aryl group, or a cyano-substituted aryl group. At least one of $Ar^1$ to $Ar^5$ is a cyano-substituted aryl group. Specific examples are shown below.

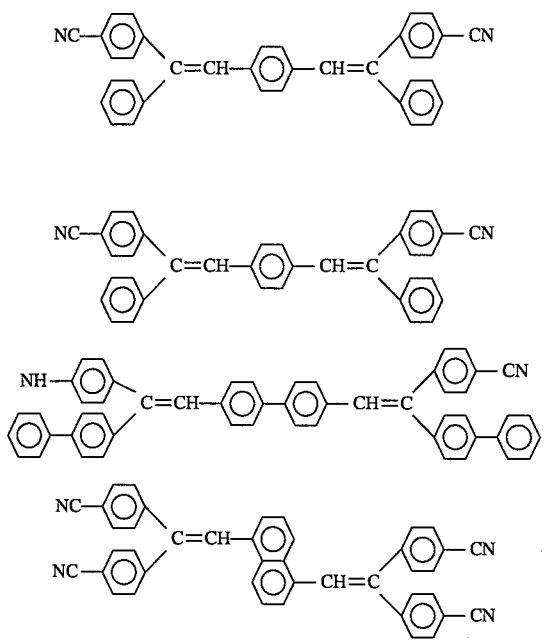

The above compounds (a) to (e) can be preferable compounds to be used in the present invention, if they are organic compounds having electron-accepting groups. The compounds of the present invention are not limited to those having specific structures described above. If adhesion or combination of a metal and an organic compound (formation of complexes is included) can be maintained, an organic compound may be substituted for any of an alkyl group, an alkoxyl group, an aryl group, an alkoxyalkyl group, an aryloxyalkyl group, a hydroxyl group, a hydroxyalkyl group, an aralkyl group, an alkylamino group, an arylamino group, a nitroalkyl group, an alkylcarbonyl group and an alkoxycarbonyl group.

Moreover, a polymer having the above organic low-molecular structure, for example, a polymer having said structure as a pendent group, or a polymer having said structure in the main chain structure may be used. This is because the polymer maintains a property of adhering to or combining with an electron-injectable metal.

As an organic compound forming complexes, a porphyrin or phthalocyanine compound having the following structural formula (VI) can preferably be used.

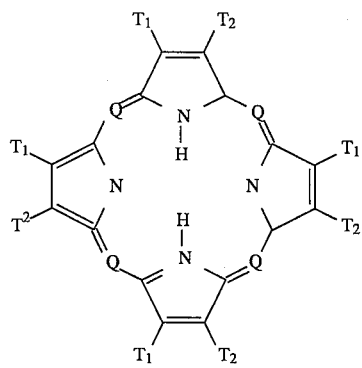

In the above formula, Q is —N= or —C(R)=. R is a hydrogen atom, an alkyl group, an aralkyl group, an aryl group or a heterocyclic group. $T_1$ and $T_2$ are a hydrogen atom, or combine with each other to complete an unsaturated six-membered ring, and further, may have a substituent such as an alkyl group, an aryl group, a halogen atom, and a heterocyclic group. Compound (VI) may have already formed a complex with a metal atom. Such a complex-forming organic compound, which is not an acceptor molecule, can be used as an organic compound in the present invention, if it has the ability of forming a complex with an electron-injectable metal. As another kind of organic compound, the one having a property of adhering to an electron-injectable metal can be used. An Example of such compounds is an oxynoide chelate compound, which has been found to form a good cathode of electron-injectable metal:organic compound. The compound represented by the following general formula (VII) is preferable.

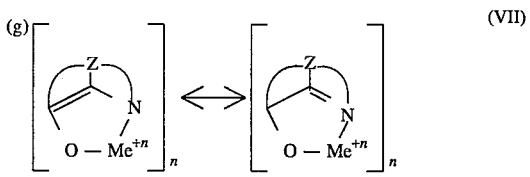

In the formula, Me is a metal, and n is an integer of 1 to 3. Z is independently in each case an atom completing a nucleus having at least two condensed aromatic rings.

From the foregoing it is clear that the metal can be a monovalent, divalent, or trivalent metal. The metal can, for example, be an alkali metal such as lithium, sodium, or potassium; an alkaline earth metal such as magnesium or calcium; or an earth metal such as boron or aluminum. Generally, any monovalent, divalent, or trivalent metal known as a useful chelating metal can be used.

Z completes a heterocyclic nucleus containing at least two condensed aromatic rings, at one of which there is an azole or azine ring. Additional rings, including both aliphatic and aromatic rings, can be condensed with these two required rings, if necessary. In order to avoid adding molecular bulk without improving the function, the number of the ring atoms is preferably 18 or less.

Examples of useful oxynonide chelate compounds are shown below.

Aluminum trisoxine (also known as tris(8-quinolinol)aluminum)

Magnesium bisoxine (also known as bis(8-quinolinol)magnesium)

Bis[benzo(f)-8-quinolinol]zinc

Bis(2-methyl-8-quinolinolate)aluminum oxide

Indium trisoxine (also known as tris(8-quinolinol)indium)

Aluminum tris(5-methyloxine) (also known as tris(5-methyl-8-quinolinol)-aluminum)

Lithium oxine (also known as 8-quinolinol lithium)

Gallium trisoxine (also known as tris(5-chloro-8-quinolinol)-gallium)

Calcium bis(5-chlorooxine) (also known as bis(5-chloro-8-quinolinol)-calcium)

Poly[zinc(II)-bis(8-hydroxy-5-quinolinonyl)methane]

Dilithium epindolidione

Of the above preferable compounds, the most preferable ones are compounds (a), (b), (e) and (g), for example, TCNQ, TNF, NTDI, PTDI and Alloxadine.

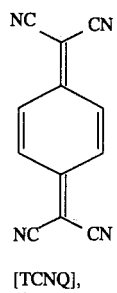

[TCNQ],

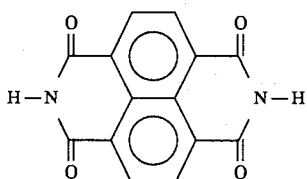

[TNF],

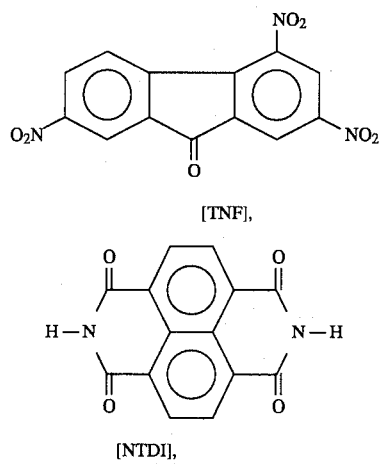

[NTDI],

[PTDI],

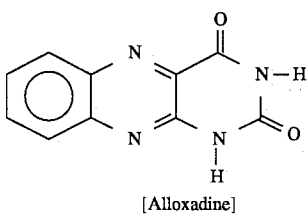

[Alloxadine]

In the general formulas (I) to (VII) of compounds (a) to (g), the preferable alkyl group is an alkyl group having 1 to 10 carbon atoms such as methyl, ethyl, propyl, and butyl. The preferable aryl group is an aryl group having 6 to 20 carbon atoms such as phenyl, naphthyl, antonyl, pyrenyl, and perirenyl. The preferable alkoxyl group is an alkoxyl group having 1 to 10 carbon atoms such as methoxyl, ethoxyl, propoxyl, and butoxyl.

A process for formation of a thin film electrode using the above electron-injectable metal and the organic compound will be described below.

As a means of forming a thin film, various methods can be used, but to obtain a uniform and minute thin film, which is a good form of cathode when used as a cathode of an EL device, a method for forming a thin film by deposition from a gas-phase, that is, a vapor deposition method is preferably used. Particularly, it is preferred to form a thin film by the dual vapor deposition method wherein a vapor deposition source of a metal and a vapor deposition source of an organic compound are separated and deposited each simultaneously because the temperature at which an organic compound changes into gaseous compound is extremely different from the temperature at which a metal changes into a gaseous metal.

In the practical vapor deposition, a vapor deposition source of a metal and a vapor deposition source of an organic compound are set at temperatures at which each vapor pressure increases sufficiently, and when the desired vapor deposition rates of an organic compound and a metal are reached, the shutter above the vapor deposition sources is opened to start vapor deposition. When the intended film thickness is obtained, the shutter is closed to stop preparation. During vapor deposition, the pressure is preferably not more than $10^{-5}$ Torr. The substrate temperature is not otherwise limited, but should be set at the temperature at which the thin film forming property of the organic thin film as an under layer is not lost. As the thin film forming property of an organic thin film may sometimes be lost by melting or crystallization, the substrate temperature is preferably 0° to 100° C., more preferably room temperature or so. During vapor deposition of an organic compound, it should be noted that the decomposition temperature is not reached. The organic compound may sometimes liberate gas in the course of heating, which is due to the residual solvent in the washing process and hardly takes part in the decomposition.

The composition ratio of the organic compound to the electron-injectable metal is 1 to 30 by weight. With a slight amount of the organic compound, a uniform and minute metal thin film (cathode) having very small and good plane resistance value can be formed. The weight ratio of the organic compound to the metal being not more than 30%, a property of a metal precedes, which is preferable for use. This weight ratio is most preferably in the range of 1 to 10%, wherein a particularly good plane resistance value can be maintained. Converted into a molar ratio, the above weight ratio of 1:30 is not more than about 1% as the molar ratio. Only a small amount of the organic compound provides the above good result.

Usually, one component is used as the organic compound, but if necessary, using two or more organic components and a metal, an electrode can be prepared. As the metal, plural components, for example, Mg and Yb can be used.

The film thickness is preferably 10 to 500 nm. When the film is too thin (not more than 10 nm), the plane resistance value is increased and oxidation occurs easily. When the film is too thick, it takes much time for the production. Most preferably, the film thickness is 50 to 300 nm. The vapor deposition rate of the metal is preferably 0.1 to 10 nm/sec, most preferably 0.5 to 5 nm/sec.

Some metals are degassed during treatment. The quadrupole mass spectrometer proved that said degassed composition consists of adsorbed gases of CO, $CO_2$, $H_2O$, and $H_2$. $H_2O$, CO, and $CO_2$ oxidize a metal undesirably during vapor deposition. It is preferred to conduct washing or melting of a metal vapor deposition source previously for removing the adsorbed gases.

The mechanism for formation of a thin film electrode of the present invention will be described as follows. When Mg, Zn, and rare earth metals (Yb, Eu, etc.) as the most preferable examples of the electron-injectable metal are vapor deposited independently, they hardly adhere to an organic thin film or glass and thus a metal thin film suitable for an electrode cannot be obtained. On the other hand, when an organic low-molecular compound having a property of adhering to or combining with these metals, preferably an acceptor compound or a complex-forming compound, is used and the two co-vapor depositions are conducted, they can easily adhere to an organic thin film or glass to form a complete metallic thin film.

This might be because an organic compound first adheres to the surface to which a metal does not adhere independently, and then a metal adheres to or combine with said organic compound to form a thin film. A metal may independently condense and thereby form an extremely discontinuous and uneven thin film, but the organic compound inhibits said condensation and forms a uniform and minute thin film. In the case of a metal easily adhering to an organic thin film and glass (e.g., Al), the minuteness is increased by employing the process of the present invention, the plane resistance value is decreased and a good metal thin film can be obtained.

A uniform and minute thin film comprising an electron-injectable metal and an organic compound is hardly oxidized compared with a thin film comprising only a metal. Moreover, the advantage of preparing a thin film comprising an electron-injectable metal and an organic compound is that, since the temperature of the vapor deposition source of an organic compound is not more than 500° C, an organic thin film is not damaged by radiation heat of said vapor deposition source.

Since in some electron-injectable metals, such as Mg, Yb and Eu, the temperature of the vapor deposition source is low, the damage of an organic thin film can be inhibited almost completely by selecting a metal species.

There are a variety of embodiments of the structure of an EL device using a thin film electrode of the present invention as a cathode, and basically a light emitting layer is sandwiched between a pair of electrodes (anode and cathode), and optionally a hole-injection layer and an electron-injection layer may be inserted therein. Specific examples of the structures are: (1) anode/light emitting layer/cathode, (2) anode/hole-injection layer/light emitting layer/cathode, (3) anode/hole-injection layer/light emitting layer/electron-injection layer/cathode, and (4) anode/light emitting layer/electron-injection layer/cathode. Said hole-injection layer or electron-injection layer is not always necessary, but these layers can improve luminosity.

In the device of the above structure, any device is preferably supported on the substrate. Said substrate is not otherwise limited, and the one in common use for an EL device, for example, glass, transparent plastic or quartz can be used.

The light emitting layer in an EL device of the present invention can be prepared by forming a thin film by the well-known method (vapor deposition method, LB process, spin-coating method, casting method, etc.) from various light emitting material conventionally used. Said light emitting layer has three functions: injection function of injecting holes from an anode or a hole-injection and transport layer and elctrons from a cathode or an electron-injection and transport layer to the emitting layer upon application of an electric field; transport function of transporting injected charges (electrons and holes) by the action of an electric field; and light emitting function of providing a field for recombination of electrons and holes, thereby emitting light.

There may be a difference in ease between hole injection and electron injection, and a difference in transport ability represented by mobilities of holes and electrons, but either one of the charges is preferably moved.

As to the above light emitting material, various ones having the above functions and emitting fluorescence in a solid state can be used as a light emitting material.

Various well-known ones, for example, a coumarin compound (Japanese Patent Application No. 009995/1989) represented by 3-(2'-N-methylbenzoimidazolyl)-7-N,N-diethylaminocoumarin (coumarin 30), a phthaloperinon compound (J. Appl. Phys. Vol. 27, L. 713 (1988)), a benzooxazolyl or benzothiazole compound (Japanese Patent Application Laid-Open No. 194393/1984), a metal-chelated oxanoide compound (Japanese Patent Application Laid-Open No. 295695/1988), a stilbene compound (European Patent Nos. 0319881 and 0373582), a dimethlydine compound (European Patent No. 0388768) and a perylene compound can be used.

The thickness of the light emitting layer can be determined appropriately, but usually, it is in the range of 5 nm to 5 μm.

As to the anode, a metal, an alloy, an electroconducting compound or a mixture thereof, all having a large work function (not less than 4.1 eV), is preferably used as an electrode material. Specific examples of such electrode materials are a metal such as Au, and a dielectric transparent material such as CuI, ITC, $SnO_2$ and ZnO. Said anode can be prepared by forming a thin film by the vapor deposition or sputtering method, using said electrode material. To obtain light emission from said anode, the transmittance is preferably more than 10% and the resistance of the sheet as an electrode is not more than several hundred Ω/□.

Moreover, the film thickness is, depending on the material, usually determined in the range of 10 nm to 1 μm, preferably 10 to 200 nm. In this EL device, either one of said anode and cathode should be transparent or translucent because light emission is transmitted and the harvest efficiency of light emission is good.

As described above, the structure of the EL device of the present invention has various embodiments. The hole-injection layer (hole-injection and transport layer) in an EL device having the above structures (2) and (3) comprises a hole-transporting compound and has a function of transporting holes injected from an anode into a light emitting layer. By sandwiching said hole-injection layer between an anode and a light emitting layer, more holes are injected into a light emitting layer at an applied lower voltage, and further, electrons injected from a cathode or an electron-injection layer into a light emitting layer are accumulated in the vicinity of the interface in the light emitting layer due to an electron barrier existing in the interface between a light emitting layer and a hole-injection layer, thereby increasing luminous efficiency to form a device having excellent luminous performance.

The hole-transporting compound to be used for the above hole-injection layer is placed between two electrodes where an electric field is applied, and can transport the holes, which are injected from the anode, into the light emitting layer properly. A preferably hole-transporting compound has, for example, a hole mobility of at least $10^{-6}$ $cm^2/V \cdot sec$ when an electric field of $10^4$ to $10^6$ V/cm is applied.

Said hole-transporting compound, which has the above preferable properties, is not particularly limited and any compound can be used selecting from those conventionally used as a charge-transporting material for holes in a photoconductive material, or those commonly used for a hole-injection layer of an EL device.

Examples of said charge-transporting material are, for example, triazole derivatives (described in the specification of U.S. Pat. No. 3,112,197, etc.), oxadiazole derivatives (described in the specification of U.S. Pat. No. 3,189,447, etc.), imidazole derivatives (described in Japanese Patent Publication No. 16096/1962, etc.), polyarylalkane derivatives (described in the specifications of U.S. Pat. Nos.

3,615,402, 3,820,989 and 3,542,544, and in Japanese Patent Publication Nos. 555/1970 and 10983/1976, and further in Japanese Patent Application Laid-Open Nos. 93224/1976, 17105/1980, 4148/1981, 108667/1980, 156953/1980 and 36656/1981, etc.), pyrazoline derivatives or pyrazolone derivatives (described in the specifications of U.S. Pat. Nos. 3,180,729 and 4,278,746, and in Japanese Patent Application Laid-Open Nos. 88064/1980, 88065/1980, 105537/1974, 51086/1980, 80051/1981, 88141/1981, 45545/1982, 112637/1979 and 74546/1970, etc.), phenylenediamine derivatives (described in the specification of U.S. Pat. No. 3,615,404, and in Japanese Patent Publication Nos. 10105/1976, 3712/1971 and 25336/1972, and further in Japanese Patent Application Laid-Open Nos. 53435/1979, 110536/1979 and 119925/1979, etc.), arylamine derivatives (described in the specifications of U.S. Pat. Nos. 3,567,450, 3,180,703, 3,240,597, 3,658,520, 4,232,103, 4,175,961 and 4,012,376, and in Japanese Patent Publication Nos. 35702/1974 and 27577/1964, and further in Japanese Patent Application Laid-Open Nos. 144250/1980, 119132/1981 and 22437/1981, and German Patent No. 1,110,518, etc.), amino-substituted chalcone derivatives (described in the specification of U.S. Pat. No. 3,526,501, etc.), oxazole derivatives (described in the specification of U.S. Pat. No. 3,257,203, etc.), styrylanthracene derivatives (described in Japanese Patent Application Laid-Open No. 46234/1981, etc.), fluorenone derivatives (described in Japanese Patent Application Laid-Open No. 110837/1979, etc.), hydrazone derivatives (described in the specification of U.S. Pat. No. 3,717,462, and in Japanese Patent Application Laid-Open Nos. 9143/1979, 52063/1980, 52064/1980, 46760/1980, 85495/1980, 1350/1982 and 148749/1982, etc.), and stilbene derivatives (described in Japanese Patent Application Laid-Open Nos. 210363/1986, 228451/1986, 14642/1986, 72255/1987, 47646/1987, 36674/1987, 10652/1987, 30255/1987, 93445/1985, 94462/1985, 174749/1985 and 175052/1985, etc.).

The above compounds can be used as a hole-transporting compound, but it is preferred to use porphyrin compounds (described in Japanese Patent Application Laid-Open No. 295695/1988), aromatic tertiary amine compounds or styrylamine compounds (described in the specification of U.S. Pat. No. 4,127,412, and Japanese Patent Application Laid-Open Nos. 27033/1978, 58445/1979, 149634/1979, 64299/1979, 79450/1980, 144250/1980, 119132/1981, 295558/1986, 98353/1986 and 295695/1988), and most preferably, said aromatic tertiary amine compounds are used.

Representative examples of said porphyrin compounds are porphyrin; 1,10,15,20-tetraphenyl-21H,23H-porphyrin copper (II), 1,10,15,20-tetraphenyl-21H,23H-Porphyrin zinc (II), 5,10,15,20-tetrakis(pentafluorophenyl)-21H,23H-Porphyrin, silicon phthalocyanineoxide, aluminum phthalocyaninechloride, phthalocyanine (nonmetal), dilithium phthalocyanine, copper tetramethylphthalocyanine, copper phthalocyanine, chrome phthalocyanine, zinc phthalocyanine, lead phthalocyanine, titanium phthalocyanineoxide, magnesium phthalocyanine, and copper octamethylphthalocyanine. Representative examples of said aromatic tertiary amine compounds or styrylamine compounds are N,N,N',N'-tetraphenyl-4,4'-diaminobiphenyl, N,N'-diphenyl-N,N'-di(3-methylphenyl)-4,4'-diaminobiphenyl, 2,2-bis(4-di-p-tolylaminophenyl)propane, 1,1-bis(4-di-p-tolylaminophenyl) cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)phenylmethane, bis(4-di-p-tolylaminophenyl)phenyl methane, N,N'-diphenyl-N,N'-di(4-methoxylphenyl)- 4,4'-diaminobiphenyl, N,N,N',N'-tetraphenyl- 4,4'-diaminodiphenylether, 4,4'-bis(diphenylamino)quadriphenyl, N,N,N-tri(p-tolyl)amine, 4-(di-p-tolylamino)- 4'-4(di-p-tolylamino)styryl stilbene, 4-N,N-diphenylamino-( 2-diphenylvinyl)benzene, 3-methoxyl-4'-N,N-diphenylamino-stilbene, and N-phenylcarbazole.

Said hole-injection layer in the above EL device may be made up of one layer comprising one, or two or more hole-transporting compounds, or a laminate of hole-injection layers comprising different compounds from those of the above layer.

On the other hand, the electron-injection layer (electron-injection and transporting layer) in an EL device having the above structure (3) comprises an electron-transporting compound, and has a function of transporting electrons injected from a cathode into a light emitting layer. Said electron-transporting compound is not particularly limited, and any compound can be used selecting from the conventional well-known compounds. Preferable examples of said electron-transporting compound are nitro-substituted fluorenone derivatives such as:

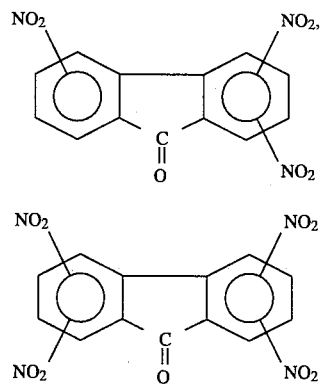

thiopyrandioxide derivatives such as:

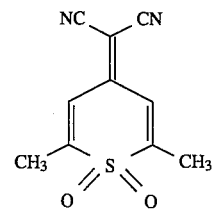

diphenylquinone derivatives such as:

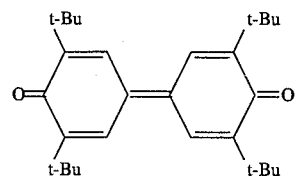

(described in Polymer Preprints, Japan, Vol. 37, No. 3, P. 681 (1988), etc.), compounds such as:

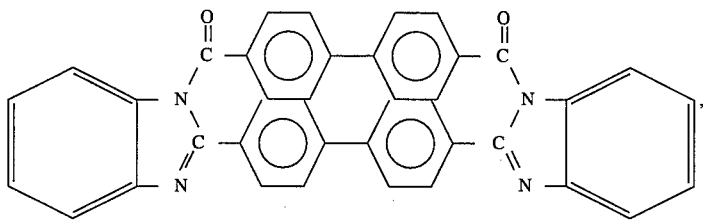

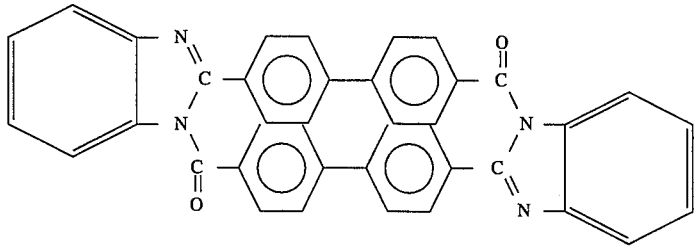

(described in J. Apply. Phys., Vol. 27, p. 269 (1988), etc.), anthraquinodimethane derivatives (described in Japanese Patent Application Laid-Open Nos. 149259/1982, 55450/1983, 225151/1986, 233750/1986 and 104061/1988, etc.), fluorenylidenemethane derivatives (described in Japanese Patent Application Laid-Open Nos. 69657/1985, 143764/1986, 148159/1986, etc.), anthrone derivatives (described in Japanese Patent Application Laid-Open Nos. 225151/1986 and 233750/1986, etc.), and dioxazole derivatives such as:

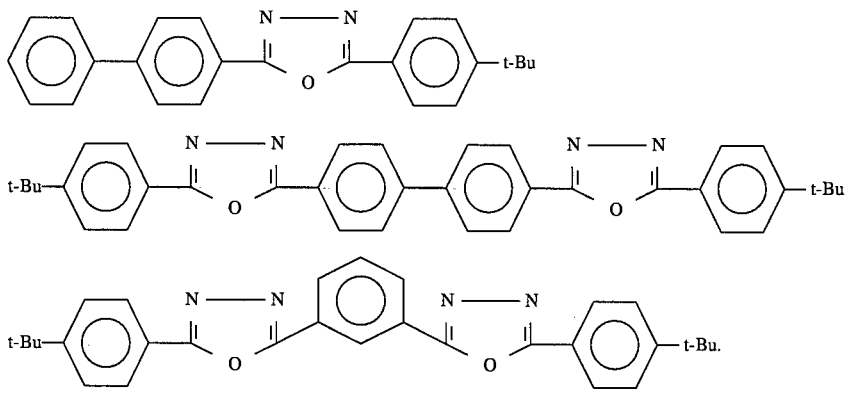

Subsequently, the preferable method for preparing an EL device using a thin film electrode of the present invention will be explained with each example of various devices. The EL device comprising the above structure of anode/light emitting layer/cathode is prepared in the following manner. First, on the proper substrate, a thin film comprising the desired electrode material, for examle, the material for an anode is formed in a thickness of not more than 1 μm, preferably in the range of 10 to 200 nm by the vapor deposition or sputtering method to prepare an anode. Then, on said anode, the compound represented by the general formula (I) as a light emitting material is formed into thin film to prepare a light emitting layer. As the method for forming a thin film from said light emitting material, for example, a spin-coating method, a casting method and a vapor deposition method can be used. The vapor deposition method is preferable in the advantages that a uniform thin film can be obtained and pinholes are less likely to be formed.

When said vapor deposition method is employed for forming a thin film from said light emitting material, the conditions of vapor deposition vary depending upon the kind of the organic compound to be used for a light emitting layer, or the desired crystal structure and the aggregated structure of the molecular-accumulated film. Generally, it is preferred to select appropriately in the following ranges: a temperature for heating boat of 50° to 400° C., a pressure of $10^{-5}$ to $10^{-3}$ Pa, a vapor depositing rate of 0.01 to 50 nm/sec, a substrate temperature of −50° to +300° C., and a film thickness of 5 nm to 5 μm. After forming said light emitting layer, a thin film comprising the above electron-injectable metal and organic compound is formed thereon in a thickness of not more than 1 μm, preferably 50 to 200 nm to prepare a cathode, whereupon the desired EL device can be obtained. Said EL device can be prepared in reverse order, that is, in order of a cathode, a light emitting layer and an anode.

Subsequently, the process for preparation of an EL device comprising anode/hole-injection layer/light emitting layer/cathode will be explained. First, an anode is formed in the same manner as in the above EL device, and then a thin film comprising a hole-transporting compound is formed thereon by the vapor deposition method to prepare a hole-injection layer. In this case, the conditions of vapor deposition are according to those of forming a thin film of the above light emitting material. Then, on said hole-injection layer, a light emitting layer and a cathod are prepared in turn in the same manner as in the preparation of the above EL device to obtain the desired EL device.

Said EL device can be prepared in reverse order, that is, in order of a cathode, a light emitting layer, a hole-injection layer, and an anode.

Moreover, the process for preparation of an EL device comprising anode/hole-injection layer/light emitting layer/ electron-injection layer/cathode will be explained. First, an anode, a hole-injection layer and a light emitting layer are prepared in turn in the same manner as in the preparation of the above EL device, and then on said light emitting layer, a thin film comprising an electron-transporting compound is formed on the light emitting layer by the vapor deposition method to prepare an electron-injection layer. Then, on said layer, a cathode is prepared in the same manner as in the preparation of the above EL device to obtain the desired EL device. Said EL device can be prepared in reverse order, that is, in order of a cathode, an electron-injection layer, a light emitting layer, a hole-injection layer, and an anode.

When a DC voltage of about 3 to 40 V is applied to the EL device thus obtained, with an anode being polarity (+) and a cathode being polarity (−), an emission of light is observed at a transparent or translucent electrode. When a voltage is applied with the other polarity, a current does not flow and no emission of light is obtained. When AC voltage is applied, an emission of light is obtained only with an anode being (+) and a cathode being (−). Any wave form of AC voltage may be applied.

As explained above, in the thin film electrode of the present invention, the uniformity and minuteness are increased, the volume resistivity is greatly decreased, the adhesion to an organic thin film as an under layer or glass is improved, a thin film can easily be formed by the vapor deposition method, and further an organic thin film is not damaged during formation of film. Particularly, in using the thin film electrode as a cathode for an EL device, the luminous efficiency is increased, the uniformity of light emission is given, and an EL emission with high brightness and efficiency can be obtained at a low voltage.

Accordingly, the EL device using a thin film electrode of the present invention is expected to be utilized as a light emitting material for various display devices.

Subsequently, the present invention is described in greater detail with reference to the examples and the comparative examples.

EXAMPLE 1

White plate glass was ultrasonically washed with isopropyl alcohol for 30 minutes, and after dipping in isopropyl alcohol, it was taken out and then dried using dry nitrogen gas. Said glass as a substrate was attached to the substrate holder of the vapor deposition system produced by ULVAC Co., Ltd. Mg ribbon washed with dilute hydrochloric acid was placed in an electrically-heated boat made of molybdenum, which was attached to the terminal of the vapor deposition system. 200 mg of TNF described above was placed in another electricaly-heated boat made of molybdenum, which was attached to another terminal. The vacuum chamber was evacuated to $6\times10^{-6}$ Torr. The boat containing TNF was electrically heated so that the vapor deposition rate may be 0.1 nm/sec, and then the boat containing Mg was heated so that the vapor deposition rate may be 1 to 1.5 nm/sec. Subsequently, opening the shutter covering the substrate, the vapor deposition was started and continued until the film thickness reached 120 nm using a corrected quartz oscillator. The pressure of the vacuum chamber was returned to atmospheric pressure and a thin film comprising Mg:TNF was taken out. After it was confirmed that the thin film had a uniform plane mirror, the plane resistance value was measured by the four-terminal method. As a result, an extremely excellent value of 0.85 $\Omega/\square$ was obtained. The surface profiler thickness meter showed that the thickness in the vicinity of the measuring point was 130 nm. Accordingly, the volume resistivity was $1.1\times10^{-5}$ $\Omega\cdot$cm. A uniform and minute thin film with TNF as a nucleus was produced.

According to the "Handbook of Chemistry", the 3rd edition, Fundamentals II, Maruzen, 1984, the volume resistivity obtained in Mg polycrystal is $4.45\times10^{-6}$ $\Omega\cdot$cm. Therefore, the metal thin film obtained in said example maintains about twice as good value as said Mg polycrystal. The plane resistance value of Mg:Ag thin film described in Europe Patent No. 0,278,757 is 3.36 $\Omega/\square$ (converted into 100 nm).

Comparative Example 1

Mg was vapor deposited independently in the same manner as in Example 1 except that the boat containing TNF was not electrically heated. The obtained Mg thin film was deep gray and the plane resistance value was not less than 1 k $\Omega/\square$. This shows that Mg hardly adheres to glass independently and the formation of a uniform thin film is difficult.

Examples 2 to 10

A thin film comprising Mg:organic compound was prepared in the same manner as in Example 1 except that the kind of an organic compound (acceptor compound and complex-forming compound), the ratio of vapor deposition rate and the film thickness were determined according to the conditions shown in Table 1. The results are shown in Table 1.

TABLE 1

| No. | Kind of Organic Compound | Vapor Deposition Rate Ratio (Mg/Organic Substance) (nm/sec) | Film Thickness (nm) | Plane Resistance Value $\Omega/\square$ | Plane Resistance Value $\Omega/\square$ (converted into 100 nm) |
| --- | --- | --- | --- | --- | --- |
| Example 2 | TCNQ | 1/0.1 | 140 | 1.1 | 1.5–1.6 |
| Example 3 | PTDI | 1/0.1 | 140 | 1.1 | 1.5–1.6 |

TABLE 1-continued

| No. | Kind of Organic Compound | Vapor Deposition Rate Ratio (Mg/Organic Substance) (nm/sec) | Film Thickness (nm) | Plane Resistance Value Ω/□ | Plane Resistance Value Ω/□ (converted into 100 nm) |
|---|---|---|---|---|---|
| Example 4 | Alloxadine | 1–1.5/0–0.1 | 100 | 0.7–0.8 | 0.7–0.8 |
| Example 5 | DQ*¹ | 1/0.1–0.3 | 60 | 27.2 | 16.3 |
| Example 6 | TPYP*² | 1/0.1 | 140 | 5.4–7.4 | 7.6–10.4 |
| Example 7 | Nonmetallic phthalocyanine | 1/0.1 | 100 | 1.7 | 1.7 |
| Example 8 | TPP*³ | 1/0.1 | 100 | 1.0 | 1.0 |
| Example 9 | OEP*⁴ | 1/0.2 | 120 | 2.0 | 1.7 |
| Example 10 | NTDI | 1–1.2/0.1–0.3 | 120 | 1.9 | 1.6 |

*¹DQ

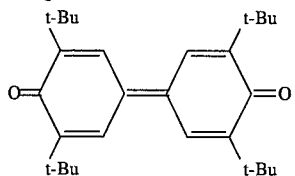

*²TPYP 5,10,15,20-tetra(4-pyridyl)porphyrin
*³TPP 5,10,15,20-tetraphenylporphyrin
*⁴OEP 2,3,7,8,12,13,17,18-octaethylporphyrin As shown in Table 1, using various acceptor compounds and complex-forming organic compounds, an excellent thin film for electrode comprising Mg:organic compound was obtained.

EXAMPLE 11

A thin film comprising Mg:organic compound was prepared in the same manner as in Example 1 except that the above TCNQ was used as an organic compound and the film thickness was 18 to 19 nm. As a result, though the film was extremely thin, the plane resistance value was as extremely low as 4.3 Ω/□, showing an excellent value. The volume resistivity converted was $7.9 \times 10^{-6}$ Ω·cm. In an extremely thin film, a good value was obtained. This shows that the obtained thin film is uniform and minute.

As well-known usually, in a vapor deposition film, the volume resistivity is extremely different from the value of the bulk and in many cases the former is larger than the latter for the reason that when the film is thin, it is likely to have an island-like structure (for example, by Kinbara, "Thin Film" the 4th edition, Shokabo Publisher p. 166 to 175).

EXAMPLES 12 TO 14

A thin film comprising electron-injectable metal:organic compound was prepared in the same manner as in Example 1 except that TCNQ was used as an organic compound and Yb, Zn and In were used as a metal as shown in Table 1. The results were shown in Table 2.

The volume resistivities of Yb, Zn and In in the bulk form were $2.9 \times 10^{-6}$, $8.92 \times 10^{-6}$, and $8.37 \times 10^{-6}$ Ω·cm, respectively, according to the above the "Handbook of Chemistry".

TABLE 2

| No. | Kind of Metal | Vapor Deposition Rate Ratio Metal/TCNQ (nm/sec) | Film Thickness (nm) | Plane Resistance Value Ω/□ | Volume Resistivity Ω·cm |
|---|---|---|---|---|---|
| Example 12 | Yb | 1.1–1.2/0.1 | 110 | 7.0 | $6.1 \times 10^{-5}$ |
| Example 13 | Zn | 1.0–1.1/0.1 | 100 | 2.0 | $2 \times 10^{-5}$ |
| Example 14 | In | 1.2/0.1 | 100 | 3.4 | $3.4 \times 10^{-5}$ |

EXAMPLE 15

White plate glass equipped with ITO (produced by HOYA) was ultrasonically washed with isopropyl alcohol for 30 minutes, and then ultrasonically washed with pure water for 1 minute, and further, dipped in isopropyl alcohol, taken out and blow dried using dry nitrogen gas. Moreover, said substrate was washed for 120 seconds using the UV, ozone washing apparatus produced by Samco International Co., Ltd. Said substrate was attached to the substrate holder of the vacuum vapor deposition system produced by ULVAC Co., Ltd. 200 mg of TPD (compound of the structural formula described below) was placed in an electrically-heated boat made of Mo, which was attached to an electric terminal.

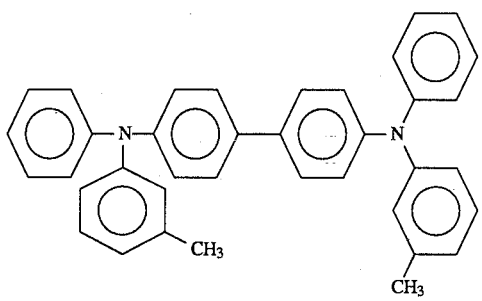

Moreover, 200 mg of Al(Ox)₃ (compound of the structural formula described below) was placed in another electrically-heated boat made of Mo, which was attached to another electric terminal.

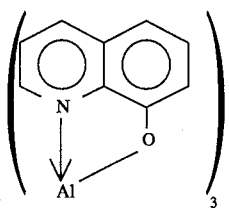

The vacuum chamber was evacuated to 10⁻⁵ Torr. The boat made of Mo containing the above TPD was electrically heated and vapor deposition was conducted at a vapor deposition rate of 0.1 to 0.3 nm/sec to reach 600 Å in thickness.

Subsequently, the boat containing Al(Ox)₃ was electrically heated and vapor deposition was conducted at a vapor deposition rate of 0.1 to 0.3 nm/sec to reach 600 Å in thickness. The pressure of the vacuum chamber was returned to atmospheric pressure and a stainless steel mask for vapor deposition was placed on the substrate/TPD layer/Al(Ox)₃ layer, which was further attached to the above substrate holder. Moreover, Mg whose surface was clarified by dilute hydrochlorination was placed in an electrically-heated boat made of Mo, and further, 200 mg of PTDI was placed in another electrically-heated boat made of Mo.

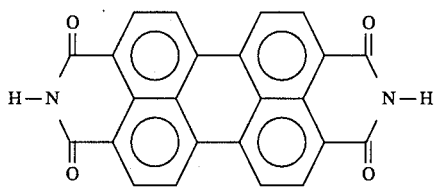

These boats were attached to the electric terminals, respectively. After the vacuum chamber was evacuated to 10⁻⁵ Torr, the above terminals were electrically heated to adjust the vapor deposition rate of Mg to 1.3 to 1.4 nm/sec and that of PTDI to 0.1 to 0.3 nm/sec. Dual vapor deposition was conducted simultaneously until the thickness of the electrode thin film comprising Mg:PTDI reached 100 nm. The pressure of the vacuum chamber was returned again to atmospheric pressure. An EL device comprising glass/ITO/TPD layer/Al(Ox)₃/Mg:organic compound was prepared.

Upon application of a voltage of 6 V with ITO of said device being an anode and an electrode comprising Mg:PTDI being a cathode, a current of 7.3 mA/cm² was passed and an emission of yellow green light with a brightness of 330 cd/m² was obtained. The luminous efficiency was 2.4 lm/W. Moreover, the voltage was raised to 8 V, whereupon a current of 37 mA/cm² was passed and the brightness was 1570 cd/m² (luminous efficiency: 1.7 lm/W).

Comparative Example 2

A substrate/ITO layer/Al(Ox)₃ layer was prepared in the same manner as in Example 15, and then a Mg:Ag electrode was prepared in place of an electrode comprising Mg:PTDI. The vapor deposition rate of Mg was 1.2 to 1.4 nm/sec and that of Ag was 0.09 to 0.11 nm/sec. The film thickness was 100 nm. The electricity test was conducted in the same manner as in Example 13. As a result, upon application of a voltage of 6 V, a current of 15.7 mA/cm² was passed and the brightness was 324 cd/m². The luminous efficiency was 11 lm/W.

As can be seen from the comparison of Example 15 with Comparative Example 2, a device using an Mg:PTDI electrode is greatly improved in luminous efficiency, which shows superiority of a thin film electrode of the present invention.

EXAMPLE 16

A cathod thin film comprising Mg:organic compound was prepared in the same manner as in Example 1 except that Al(Ox)₃ which is an Al complex of oxine having a coordination number of 3 was used as an organic compound, the vapor deposition rates of Mg and an organic compound were 2 nm/sec and 0.1 to 0.3 nm/sec, respectively, and the film thickness was 100 nm. The plane resistance determined was 2 Ω/□.

EXAMPLE 17

A cathode was prepared in the same manner as in Example 16 except that a CN-substituted stilbene derivative (structural formula described below) was used as an organic compound of a cathode comprising Mg:organic compound, the vapor deposition rates of Mg and an organic compound were 1 to 2 nm/sec and 0.1 to 0.3 nm/sec, respectively, and the film thickness was 120 nm. The plane resistance as determined was 1.0 Ω/□.

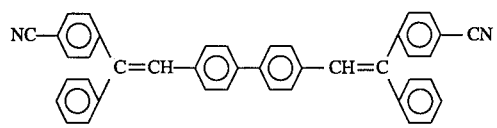

EXAMPLE 18

White plate glass equipped with ITO was washed and attached to the vacuum vapor deposition system in the same manner as in Example 15. In this case, 200 mg of each of copper phthalocyanine (CuPc), TPD and DPVBi (stilbene light emitting material having a structural formula described below) were placed in an electrically-heated boat made of Mo, which was attached to an electric terminal. The vacuum chamber was evacuated to 10⁻³ Pa. Vapor deposition was conducted in the same manner as in Example 15 so that the layers of CuPc, TPD and DPVBi might be 20 nm, 40 nm and 40 nm thick, respectively. CuPc and TPD were regarded as hole-injection layers and DPVBi as a light emitting layer. Subsequently, a cathode comprising Mg:organic compound was prepared in the same manner as in Example 15 except that Al(Ox)$_3$ was used as an organic compound and the vapor deposition rates of Mg and Al(Ox)$_3$ were 2.0 to 1.0 nm/sec and 0.1 to 0.3 nm/sec, respectively. A current was passed through a device prepared as above and the brightness was observed. At an applied voltage of 10 V, a current of 6.7 mA/cm$^2$ was passed and an emission of blue light of 230 cd/m$^2$ was observed. The emission was uniform, which showed that a cathode was formed adhering to the light emitting layer uniformly. The luminous efficiency was 1.1 lm/W, which was superior as a blue light emitting device to that of the conventional devices. An applied voltage of said device was raised to 15 V, whereupon a current of 93 mA/cm$^2$ was passed and brightness as high as 2040 cd/m$^2$ was attained.

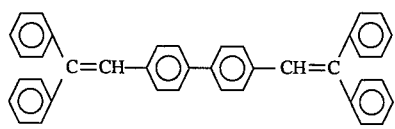

Comparative Example 3

A device was prepared in the same manner as in Example 15 except that a cathode comprising Mg:Ag was prepared in the same manner as in Comparative Example 2. A current was passed through a device and the brightness was measured. At an applied voltage of 15 V, a current of 231 mA/cm$^2$ was passed. The brightness was 1100 cd/m$^2$ and the luminous efficiency was 0.1 lm/W. In this case, the emission of light was not uniform, which shows that an Mg:Ag cathode does not adhere to the DPVBi layer uniformly. This is why the luminous efficiency was not good.

As can be seen from the comparison of Example 18 with Comparative Example 3, a cathode of the present invention was extremely improved in adhesion to the organic layer and gave uniformity of an light emission and improvement of luminous efficiency.

What is claimed:

1. An electroluminescence device which comprises (a) an anode, (b) a cathode, and disposed between said anode and said cathode (c) an organic emitting layer and (d) optionally a hole-injection layer and (e) optionally an electron-injection layer, said cathode being a thin film electrode comprising film forming amounts of an electron-injectable metal and an organic compound, said device having a structure selected from the group consisting of anode/light emitting layer/cathode, anode/hole-injection layer/light emitting layer/cathode, anode/hole-injection layer/light emitting layer/electron-injection layer/cathode and anode/light emitting layer/electron-injection layer/cathode.

2. The electroluminescence device as defined in claim 1 wherein the weight ratio of the organic compound to the electron injectable metal is 1 to 30% by weight.

3. The electroluminescence device as defined in claim 1 wherein said electron-injectable metal is selected from the group consisting of Mg, Yb, In, Eu, Ce, Er, Hf, Gd, La, Sc, Sm, Y and Zn.

4. The electroluminescence device as defined in claim 1 wherein said organic compound has a property of adhering to or combining with said electron-injectable metal.

5. The electroluminesence device as defined in claim 1 wherein said organic compound has a property of an acceptor.

6. The electroluminescence device as defined in claim 1 wherein said organic compound is represented by the formula.

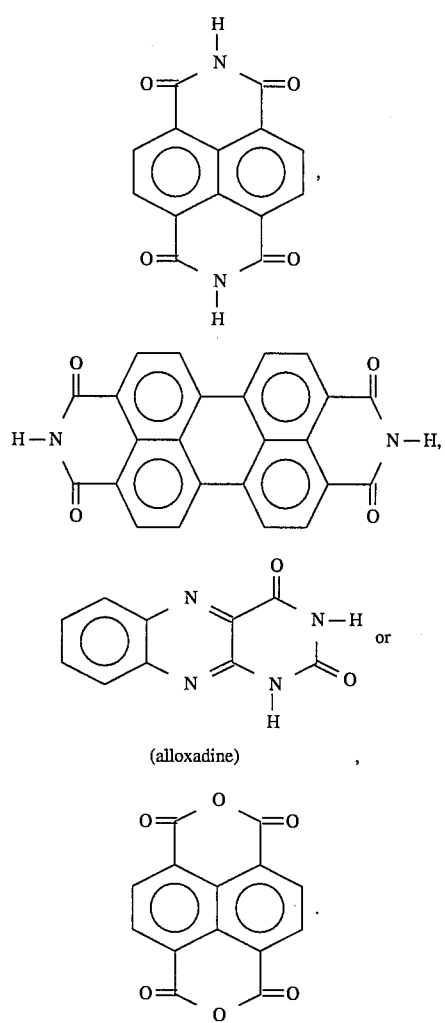

(alloxadine)

7. The electroluminescence device as defined in claim 1 wherein said organic compound has a property of forming complexes with an electron-injectable metal.

8. The electroluminescence device as defined in claim 1 wherein said organic compound is nonmetallic phthalocyanine; 5,10,15,20-tetra(4-pyridyl)porphyrin; 5,10,15,20-tetraphenylporphyrin, or 2,3,7,8,12,13,17,18-octaethylporphyrin.

9. The thin film electrode for devices as defined in claim 5 wherein said organic compound is represented by the formula

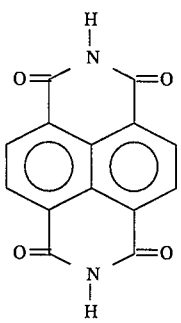

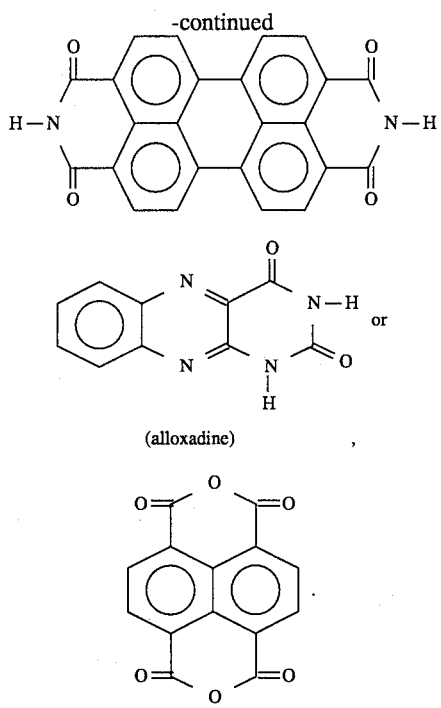

(alloxadine)

10. The thin film electrode for devices as defined in claim 7 wherein said organic compound is nonmetallic phthalocyanine; 5,10,15,20-tetra(4-pyridyl)porphyrin; 5,10,15,20-tetraphenylporphyrin, or 2,3,7,8,12,13,17,18-octaethylporphyrin.

11. The electroluminescence device as defined in claim 1 wherein the weight ratio of the organic compound to the electron injectable metal is 1 to 10% by weight.

12. The electroluminescence device as defined in claim 4 wherein said organic compound is of the formula

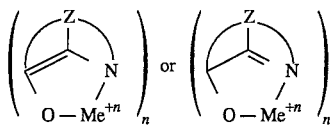

wherein Me is a metal, n is an integer of 1 to 3, and Z is an atom completing a nucleus having at least two condensed aromatic rings.

13. The electroluminescence device as defined in claim 12 wherein Me is a metal selected from the group consisting of lithium, sodium, potassium, magnesium, calcium, boron, aluminum, zinc, gallium and indium.

14. The electroluminescence device as defined in claim 12 wherein said organic compound is selected from the group consisting of tris(8-quinolinol)aluminum, bis(8-quinolinol)magnesium, bis[benzo(f)-8-quinolinol]zinc, bis(2-methyl-8-quinolinolate)aluminum oxide, tris(8-quinolinol)indium, tris(5-methyl-8-quinolinol)-aluminum, 8-quinolinol lithium, tris(5-chloro-8-quinolinol)-gallium, bis-(5-chloro-8-quinolinol)calcium, poly[zinc(II)-bis(8-hydroxy-5-quinolinonyl)methane and dilithium epindolidione.

15. The electroluminescence device as defined in claim 11 wherein the thin film electrode has a thickness of 50 to 300 nm.

16. The electroluminescence device as defined in claim 15 wherein the organic emitting layer has a thickness of 5 nm to 5 μm.

17. The electroluminescence device as defined in claim 1 having the structure: anode/hole-injection layer/light emitting layer/cathode.

18. The electroluminescence device as defined in claim 1 having the structure: anode/hole-injection layer/light emitting layer/electron-injection layer/cathode.

19. The electroluminescence device as defined in claim 1 having the structure: anode/light emitting layer/electron-injection layer/cathode.

* * * * *